(12) United States Patent
Walter et al.

(10) Patent No.: US 7,429,813 B2
(45) Date of Patent: Sep. 30, 2008

(54) PIEZOELECTRIC ACTUATOR

(75) Inventors: Gerhard Walter, Gerlingen (DE);
Armin Mann, Ludwigsburg (DE)

(73) Assignee: Robert Bosch GmbH, Stuttgart (DE)

( * ) Notice: Subject to any disclaimer, the term of this patent is extended or adjusted under 35 U.S.C. 154(b) by 159 days.

(21) Appl. No.: 10/586,033

(22) PCT Filed: Nov. 18, 2004

(86) PCT No.: PCT/EP2004/053004

§ 371 (c)(1),
(2), (4) Date: Jul. 13, 2006

(87) PCT Pub. No.: WO2005/069394

PCT Pub. Date: Jul. 28, 2005

(65) Prior Publication Data

US 2007/0152542 A1  Jul. 5, 2007

(30) Foreign Application Priority Data

Jan. 15, 2004  (DE) ........................ 10 2004 002 133

(51) Int. Cl.
*H01L 41/083* (2006.01)
(52) U.S. Cl. ..................................... 310/328; 310/366
(58) Field of Classification Search .................. 310/328, 310/366
See application file for complete search history.

(56) References Cited

U.S. PATENT DOCUMENTS

| | | | | |
|---|---|---|---|---|
| 5,446,333 A | * | 8/1995 | Ishida et al. ................. 310/334 |
| 5,828,160 A | * | 10/1998 | Sugishita ..................... 310/366 |
| 6,111,343 A | * | 8/2000 | Unami et al. ................ 310/366 |
| 6,274,967 B1 | * | 8/2001 | Zumstrull et al. ........... 310/328 |
| 6,670,866 B2 | * | 12/2003 | Ella et al. ..................... 333/133 |
| 2007/0046148 A1 | * | 3/2007 | Sugg .......................... 310/328 |

FOREIGN PATENT DOCUMENTS

| DE | 198 38 862 | 3/2000 |
|---|---|---|
| DE | 101 63 005 | 10/2002 |
| EP | 0 144 655 | 6/1985 |
| EP | 1 233 461 | 8/2002 |
| JP | 07 154005 | 6/1995 |
| JP | 2000-294843 | * 10/2000 |
| WO | WO 03/026033 | 3/2003 |

OTHER PUBLICATIONS

Patent Abstracts of Japan, vol. 1995, No. 09, Oct. 31, 1995.

* cited by examiner

*Primary Examiner*—Thomas M Dougherty
(74) *Attorney, Agent, or Firm*—Kenyon & Kenyon LLP

(57) ABSTRACT

Piezoelectric actuators having ceramic layers and electrode layers, and being provided with an outer cover layer on each end face of the piezoelectric actuator. The ceramic layers and the outer cover layers each have a predetermined dielectric constant. Rapid switching of the actuator results in considerable electromagnetic interference, which must be reduced through complex measures involving the control unit or electric lines. The device reduces electromagnetic interference by decreasing the interfering capacitance between the actuator and the actuator housing connected to ground electrically. The outer cover layers have a lower relative dielectric constant than the ceramic layers between the outer cover layers.

10 Claims, 3 Drawing Sheets ically periodic, for example. Piezoelectric ceramic layers 2 are deformed due to the electric field thus formed, and deformation of ceramic layers 2 results in deformation of piezoelectric actuator 1 in the direction of the actuator axis. Since outer ceramic layers 16 have no electrode layers 3 on both sides, they are not deformed, but due to the bonding with the remaining ceramic layers they form insulation and tolerance compensation for piezoelectric actuator 1.

PIEZOELECTRIC ACTUATOR

FIELD OF THE INVENTION

The present invention relates to a piezoelectric actuator.

BACKGROUND INFORMATION

Piezoelectric actuators having piezoelectric ceramic layers stacked to form a multilayer stack are described in, e.g., German Patent Application No. DE 198 38 862 A 1. The piezoelectric ceramic layers have electrode layers, one electrode layer being provided between each of the piezoelectric ceramic layers, an outer cover layer being provided on each end face of the piezoelectric actuator and the piezoelectric ceramic layers and the outer cover layers each having a predetermined dielectric constant. The outer cover layers are passive layers of insulation and tolerance compensation and are made of unpolarized piezoceramic. The outer cover layers are machined to produce coplanar surfaces and have a greater layer thickness than the piezoelectric ceramic layers between the outer cover layers.

Piezoelectric actuators are advantageously triggered in cycles by a control unit at a high frequency. Due to the rapid switching operations, considerable electromagnetic interference is generated and must be reduced on the control unit or on the electric feeder lines to the piezoelectric actuators through complex measures. For example, interference suppression is achieved by using interference suppression chokes and/or interference suppression capacitors on plug connections, snubber networks on switching elements and switching flank limiting measures or shielded and/or twisted electric feeder lines to the piezoelectric actuators.

SUMMARY

A piezoelectric actuator according to an example embodiment of the present invention may have the advantage over the related art that electromagnetic interference is easily reduced by having a lower dielectric constant in the outer cover layers than in the piezoelectric ceramic layers between the outer cover layers. This makes it possible to reduce electromagnetic interference much more effectively and less expensively than in the related art.

According to an advantageous example embodiment, the outer cover layers are joined either to the actuator or to a cover of a cylinder surrounding the actuator.

In the exemplary embodiments, the outer cover layers are advantageously situated so that each has an electrode layer near or adjacent to a ceramic layer. In a first advantageous embodiment, the outer cover layers are each provided on an electrode layer. The outer ceramic layers of a piezoelectric actuator according to the related art are replaced here by outer cover layers according to the present invention. No additional process is necessary in manufacturing the actuator. In the case of an actuator according to the related art, the electromagnetic interference may be reduced by additionally arranging outer cover layers according to the present invention on the outer ceramic layers of the actuator. This may require an additional procedure in the manufacture of the actuator or before assembly of the actuator in its housing.

It may also be advantageous if the outer cover layers are manufactured from a piezoelectric ceramic because in this way no additional process or additional components are necessary in the manufacture of the piezoelectric actuator.

In an advantageous exemplary embodiment, relative dielectric constant $\in_r$ of the piezoelectric ceramic of the outer cover layers is decreased by admixture of suitable additives or by another change in the composition of the material.

It is also advantageous if the outer cover layers are each joined to a ceramic layer by coating, gluing or soldering because these are particularly simple embodiments.

It may be advantageous if the actuator is prestressed under pressure on the outer cover layers between two covers, where the covers each have another insulating layer facing the outer cover layer of the actuator, this additional insulating layer having a lower relative dielectric constant $\in_r$ than the outer cover layers of the actuator. The electromagnetic interference may be reduced in this way without having to alter the piezoelectric actuator according to the related art.

BRIEF DESCRIPTION OF THE DRAWINGS

Exemplary embodiments of the present invention are illustrated in simplified form in the figures and explained in greater detail below.

DETAILED DESCRIPTION OF EXAMPLE EMBODIMENTS

Figure 1:
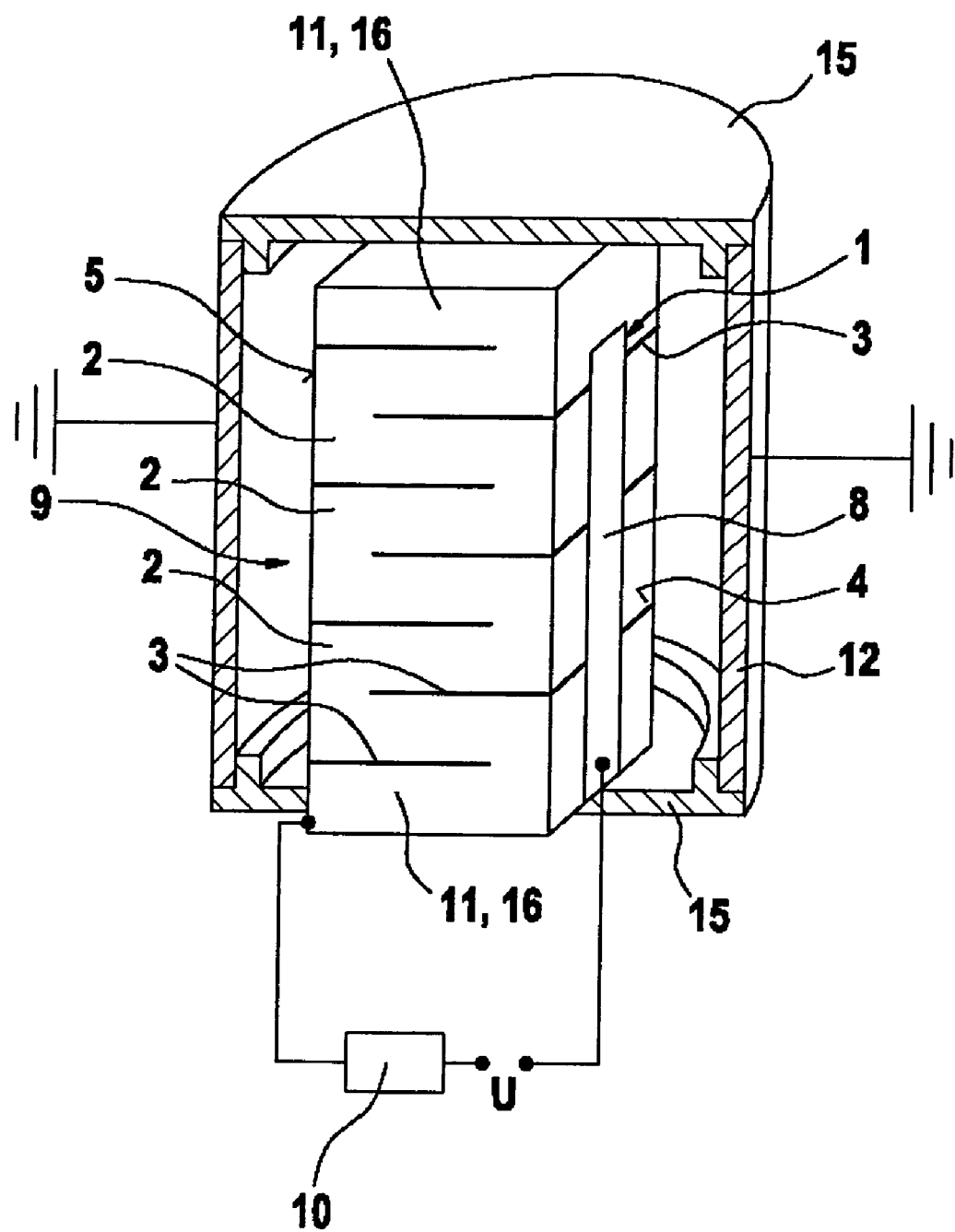
FIG. 1 shows a piezoelectric actuator according to a first exemplary embodiment of the present invention.

FIG. 1 shows schematically a piezoelectric actuator 1 composed of a plurality of stacked ceramic layers 2, forming a multilayer stack. The piezoelectric actuator extends in the direction of an actuator axis 6.

An electrode layer 3 provided between each of piezoelectric ceramic layers 2 is printed on ceramic layers 2 by a screen printing technique, for example. Ceramic layers 2 are polarizable and electrically non-conducting.

According to the first and second exemplary embodiments, actuator 1 has an outer cover layer 11 on each of its end faces. Outer cover layers 11 are connected to actuator 1 by an integrally bonded and/or frictionally locked method, for example. According to the first exemplary embodiment, outer cover layers 11 are designed as outer ceramic layers 16. Outer ceramic layers 16 are also referred to as passive layers because they are adjacent to an electrode layer 3 on only one side and have a non-polarized ceramic, for example. Ceramic layers 2 between outer ceramic layers 16 however are polarized, are each adjacent to two electrode layers 3 and therefore referred to as active layers.

Piezoelectric actuator 1 is designed in a cuboid or cylindrical shape, for example, ceramic layers 2 being square or circular in shape, for example. Electrode layers 3 are manufactured from electrically conducting material, e.g., silver-palladium, silver, copper or gold and are also referred to as inner electrodes.

Electrode layers 3 are positioned in such a way that they run alternately either from a first terminal face 4 of actuator 1 or from a second terminal face 5 of actuator 1 facing first terminal face 4, directed in the direction of ceramic layers 2 and extending up to close to particular opposing terminal face 4, 5. Electrode layers 3 directed from first terminal face 4 are electrically connected to a first outer electrode 8 and electrode layers 3 directed from second terminal face 5 are electrically connected to a second outer electrode 9, outer electrodes 8, 9 being provided, e.g., in the form of an electrically conducting layer on terminal faces 4, 5. An electric voltage may be applied between outer electrodes 8, 9, the voltage being activated and deactivated for example via an electronic control unit 10, e.g., in a cycle. When a voltage is applied between outer electrodes 8, 9, a lengthening of actuator 1 by one stroke is achieved in a known way.

Piezoelectric actuator 1 is formed by a cylinder 12 which is connected to electric ground and forms an actuator housing. Cylinder 12 is designed as a conventional tubular spring, for example. An electrically non-conducting casting compound may be provided between cylinder 12 and actuator 1 to improve the dissipation of heat. Cylinder 12 is sealed at each end with a cover 15, covers 15 being joined to cylinder 12 in an integrally bonded and/or frictionally locked manner. Cylinder 12 and covers 15 are manufactured from metal, for example.

Actuator 1 is prestressed under pressure between covers 15, for example, i.e., cylinder 12 exerts a compressive force on actuator 1 via covers 15, so each end of actuator 1 is in contact with one of covers 15.

Actuator 1 is turned on and off in a high-frequency cycle by control unit 10 as a function of operating parameters, interference currents and interference voltages being generated unintentionally by interfering capacitances to ground. The electromagnetic interference induced by the interfering capacitances results in interference in electric equipment, e.g., radio reception, and should therefore be suppressed.

For example, a first interfering capacitance $C_1$ is formed between cylinder 12 and actuator 1, whereby the side faces of electrode layers 3 facing cylinder 12 form a first capacitor plate and cylinder 12 forms a second capacitor plate. The space between cylinder 12 and actuator 1 forms a dielectric.

However, first interfering capacitance $C_1$ is small and generates only low electromagnetic interference because the side faces of electrode layers 3 facing cylinder 12 are small because of the small thickness of electrode layers 3 and the distance between cylinder 12 and actuator 1 is great. In addition, relative dielectric constant $\in_r$ of the dielectric between cylinder 12 and actuator 1 is low. First interfering capacitance $C_1$ is not influenced by the present invention.

A second interfering capacitance $C_2$ prevails between covers 15 and electrode layer 3 nearest to particular cover 15, cover 15 constituting a first capacitor plate and electrode layer 3 nearest to cover 15 constituting a second capacitor plate. The dielectric of second interfering capacitance $C_2$ is formed by one of outer ceramic layers 16, situated between cover 15 and electrode layer 3 nearest to particular cover 15.

In contrast with first interfering capacitance $C_1$, second interfering capacitance $C_2$ has a very high interference effect and is calculated from the equation $$C_2 = \frac{\varepsilon_0 \cdot \varepsilon_{r16} \cdot A_{16}}{d_{16}},$$

where $\in_0$ is the dielectric constant in vacuo, $\in_{r16}$ is the relative dielectric constant of outer ceramic layer 16, $A_{16}$ is the end face of outer ceramic layer 16 and $d_{16}$ is the thickness of outer ceramic layer 16. The thickness of outer ceramic layer 16 corresponds to the distance between cover 15 and electrode layer 3 nearest to particular cover 15.

To suppress interfering capacitance $C_2$, area $A_{16}$ and/or relative dielectric constant $\in_{r16}$ of the dielectric may be reduced and/or thickness $d_{16}$ of outer ceramic layer 16 may be increased.

An increase in thickness $d_{16}$ of outer ceramic layers 16 is possible only within narrow limits because of the small construction height available and is thus possible only with a very minor effect.

An appreciable decrease in area $A_{16}$ is impossible for reasons of mechanical strength and the power of the actuator.

According to example embodiments of the present invention, to reduce interfering capacitance $C_2$, relative dielectric constant $\in_{r16}$ of outer cover layers 11 is decreased so that outer cover layers 11 have a lower relative dielectric constant $\in_{r16}$ than piezoelectric ceramic layers 2 between outer cover layers 11.

Outer cover layers 11 are made of a material having a lower relative dielectric constant $\in_r$ than ceramic layers 2 between outer cover layers 11.

In this first exemplary embodiment, outer cover layers 11 are formed by outer ceramic layers 16 which are manufactured from a piezoelectric ceramic whose relative dielectric constant $\in_r$ is decreased, for example, by admixture of suitable additives or by another suitable change in the composition of the material. The composition of the ceramic of outer ceramic layers 16 varies in comparison with other ceramic layers 2 but the design is similar.

Relative dielectric constant $\in_r$ of the outer ceramic layers of a piezoelectric actuator according to the related art is of the same size as relative dielectric constant $\in_r$ of the ceramic layers between the outer ceramic layers.

According to example embodiments of the present invention, the outer ceramic layers of a piezoelectric actuator according to the related art are replaced by outer ceramic layers 16 having a lower relative dielectric constant $\in_{r16}$ than piezoelectric ceramic layers 2 between outer ceramic layers 16. No additional process is necessary here in manufacturing the actuator.

Relative dielectric constant $\in_{r16}$ of outer cover layers 11 is smaller than relative dielectric constant $\in_{r16}$ of ceramic layers 2 by a factor of 10 to 100, for example.

Complex interference suppression measures in control unit 10 (e.g., shielding of the electric feeder lines to actuator 1 or electronic control unit 10) may be omitted thanks to the embodiment of the piezoelectric actuator according to an example embodiment of the present invention or such measures may be supplemented very effectively so that the same interference suppression effect is achieved more easily and less expensively than in the related art or a greater interference suppression effect is achieved with the same cost expenditure as in the related art.

Figure 2:
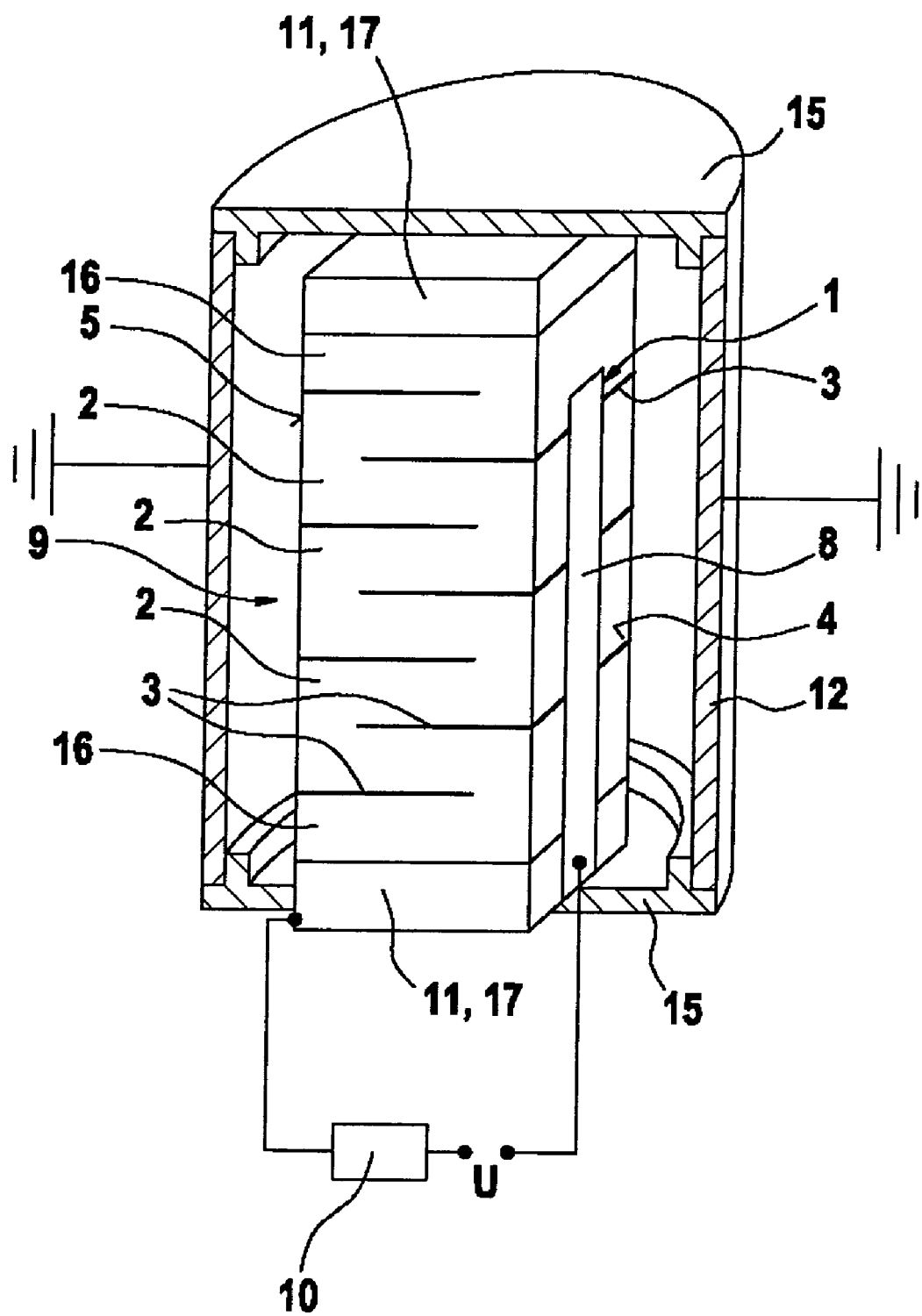
FIG. 2 shows a piezoelectric actuator according to a second exemplary embodiment of the present invention.

FIG. 2 shows a piezoelectric actuator according to a second exemplary embodiment. With the piezoelectric actuator according to FIG. 2, parts that are the same as or have the same effect as the piezoelectric actuator according to FIG. 1 are indicated with the same reference numerals. The piezoelectric actuator according to FIG. 2 differs from the piezoelectric actuator according to FIG. 1 in that an additional layer is applied to outer ceramic layers 16 of actuator 1, its dielectric constant $\in_r$ being lower than dielectric constant $\in_r$ of ceramic layers 2 between the additional layers.

In the second exemplary embodiment, piezoelectric actuator 1 has outer ceramic layers 16 which have the same composition as ceramic layers 2 between outer ceramic layers 16, as in the related art, and therefore have a relative dielectric constant $\in_r$ at least approximately the same as that of ceramic layers 2 between outer ceramic layers 16. Outer ceramic layers 16 according to the second exemplary embodiment have a greater thickness than ceramic layers 2 between outer ceramic layers 16, for example.

According to the present invention, an additional insulating layer 17 is provided on the ends on outer ceramic layers 16 of actuator 1, relative dielectric constant $\epsilon_{r17}$ of this additional insulating layer being smaller than relative dielectric constant $\epsilon_{r2}$ of ceramic layers 2. Additional insulating layers 17 are applied, e.g., by coating, gluing, soldering or the like to outer ceramic layers 16 of actuator 1 and are manufactured of glass, quartz, adhesive, lacquer, solder, silicon dioxide ceramic or equally suitable materials, for example. Additional insulating layer 17 is made of a rigid inelastic material.

Outer cover layer 11 in the second exemplary embodiment is formed by additional insulating layer 17.

The dielectric between one of two covers 17 and particular cover 15 of next electrode layer 3 in this second exemplary embodiment has two layers, outer ceramic layer 16 and additional insulating layer 17. This corresponds to a series circuit of two capacitances, so that interfering capacitance $C_2$ for the second exemplary embodiment is calculated as follows $$\frac{1}{C_2} = \frac{1}{\frac{\varepsilon_0 \cdot \varepsilon_{r16} \cdot A_{16}}{d_{16}}} + \frac{1}{\frac{\varepsilon_0 \cdot \varepsilon_{r17} \cdot A_{17}}{d_{17}}}$$

where $\epsilon_0$ is the dielectric constant in vacuo, $\epsilon_{r16}$ is the relative dielectric constant of outer ceramic layers 16, $A_{16}$ is the end face of outer ceramic layers 16 and $d_{16}$ is the thickness of outer ceramic layers 16, $\epsilon_{r17}$ is the relative dielectric constant of additional insulating layer 17, $d_{17}$ is the end face of additional insulating layer 17 and $d_{17}$ is the thickness of additional insulating layer 17.

Figure 3:
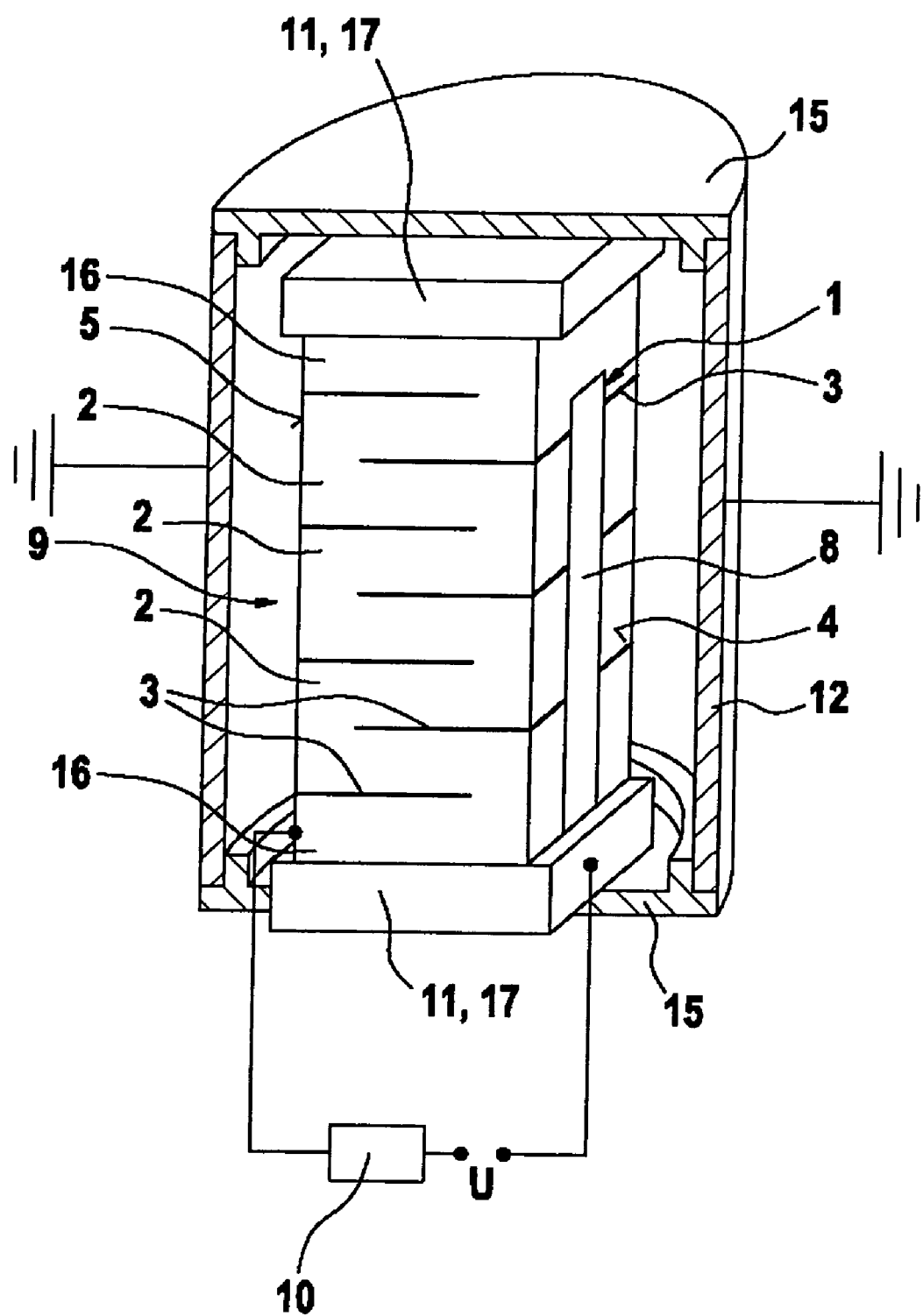
FIG. 3 shows a piezoelectric actuator according to a third exemplary embodiment of the present invention.

FIG. 3 shows a piezoelectric actuator according to a third exemplary embodiment. In the piezoelectric actuator according to FIG. 3, the parts that are the same as those with respect to the piezoelectric actuator according to FIG. 1 and FIG. 2 or parts having a similar effect are labeled with the same reference numerals. The piezoelectric actuator according to FIG. 3 differs from the piezoelectric actuator according to FIG. 1 and FIG. 2 in that additional insulating layer 17 is not attached to actuator 1 but instead is attached to one of covers 15 in an integrally bonded and/or frictionally locked manner.

According to an example embodiment of the present invention, covers 5 each have additional insulating layer 17. Additional insulating layer 17 is provided as outer cover layer 11 on an end face of cover 15 facing outer ceramic layer 16 of actuator 1. Additional insulating layer 17 of cover 15 according to this embodiment has for example an end face of the same size as ceramic layers 2 of actuator 1 or a larger end face than ceramic layers 2 of actuator 1.

Additional insulating layers 17 are attached to covers 15 of cylinder 12 by coating, gluing, soldering or the like and are made of glass, quartz, adhesive, lacquer, solder, silicon dioxide ceramics or equally suitable materials, for example.

According to the third exemplary embodiment, as in the second exemplary embodiment, actuator 1 has outer ceramic layers 16 which have the same composition as ceramic layers 2 between outer ceramic layers 16, for example, and therefore have at least approximately the same relative dielectric constant $\epsilon_r$ as ceramic layers 2 between outer ceramic layers 16.

The embodiment according to the third exemplary embodiment has the advantage that the design of actuator 1 remains unchanged and there is an improvement according to the present invention only at covers 15 of cylinder 12.

What is claimed is:

1. A piezoelectric actuator, comprising:
   piezoelectric ceramic layers stacked to form a multilayer stack;
   an electrode layer provided between each of the piezoelectric ceramic layers; and
   an outer cover layer provided on each end face of the actuator;
   wherein the piezoelectric ceramic layers and the outer cover layers each have a predetermined dielectric constant, the outer cover layers having a lower relative dielectric constant than the piezoelectric ceramic layers between the outer cover layers.

2. The piezoelectric actuator as recited in claim 1 wherein the outer cover layers are joined to the actuator.

3. The piezoelectric actuator as recited in claim 1 wherein the outer cover layers are each joined to a cover of a cylinder surrounding the actuator.

4. The piezoelectric actuator as recited in claim 1 wherein the outer cover layers are each adjacent to an electrode layer.

5. The piezoelectric actuator as recited in claim 1 wherein the outer cover layers are each provided on a ceramic layer.

6. The piezoelectric actuator as recited in claim 2 wherein the outer cover layers are manufactured from a piezoelectric ceramic.

7. The piezoelectric actuator as recited in claim 4 wherein a relative dielectric constant of ceramic of the outer cover layer is decreased by admixture of additives.

8. The piezoelectric actuator as recited in claim 3 wherein the outer cover layers are each joined to a ceramic layer by one of coating, gluing or soldering.

9. The piezoelectric actuator as recited in claim 3 wherein the outer covers layers are each manufactured from one of quartz, a glass, an adhesive, a lacquer, a solder or silicon dioxide ceramic.

10. The piezoelectric actuator as recited in claim 3 wherein the outer cover layers are designed to be rigid and inelastic.

* * * * *